(12) United States Patent
Lichter

(10) Patent No.: US 6,724,055 B2
(45) Date of Patent: Apr. 20, 2004

(54) SEMICONDUCTOR STRUCTURE HAVING AN INTERCONNECT AND METHOD OF PRODUCING THE SEMICONDUCTOR STRUCTURE

(75) Inventor: Gerd Lichter, Radeburg (DE)

(73) Assignee: Infineon Technologies AG, Munich (DE)

( * ) Notice: Subject to any disclaimer, the term of this patent is extended or adjusted under 35 U.S.C. 154(b) by 118 days.

(21) Appl. No.: 09/930,409

(22) Filed: Aug. 15, 2001

(65) Prior Publication Data

US 2002/0066932 A1 Jun. 6, 2002

Related U.S. Application Data

(63) Continuation of application No. PCT/PE00/00298, filed on Feb. 1, 2000.

(30) Foreign Application Priority Data

Feb. 15, 1999 (DE) .......................................... 199 06 291

(51) Int. Cl.⁷ .................... H01L 21/331; H01L 21/8222
(52) U.S. Cl. .................... 257/410; 257/522; 438/149; 438/319; 438/411; 438/619
(58) Field of Search ................. 257/410, 522; 438/149, 319, 411, 619

(56) References Cited

U.S. PATENT DOCUMENTS

| 4,933,743 A | 6/1990 | Thomas et al. |
| 5,185,294 A | 2/1993 | Lam et al. |
| 5,670,404 A | 9/1997 | Dai |
| 5,786,253 A | 7/1998 | Hsu |
| 5,798,559 A | 8/1998 | Bothra et al. |
| 5,828,121 A | 10/1998 | Lur et al. |
| 6,441,418 B1 * | 8/2002 | Shields et al. ............... 257/296 |
| 6,534,837 B1 * | 3/2003 | Bai et al. ..................... 257/407 |

FOREIGN PATENT DOCUMENTS

| DE | 3635 462 A1 | 4/1987 |
| EP | 0 543 158 A2 | 5/1993 |
| EP | 0 651 433 B1 | 7/2000 |

* cited by examiner

*Primary Examiner*—David Nelms
*Assistant Examiner*—Reneé R. Berry
(74) *Attorney, Agent, or Firm*—Laurence A. Greenberg; Werner H. Stemer; Ralph E. Locher

(57) ABSTRACT

The semiconductor structure has an interconnect that is isolated by a cavity from an underlying insulating layer on a support. The fabrication method provides for the interconnect firstly to be patterned on a double layer and to be provided with an insulating covering. Then, an opening is etched into the insulating covering, and the lower conductive layer is selectively removed. As a result, one the one hand, low-capacitance wiring can be fabricated and, on the other hand, this enables MOS transistors to be programmed in a simple manner.

9 Claims, 1 Drawing Sheet

SEMICONDUCTOR STRUCTURE HAVING AN INTERCONNECT AND METHOD OF PRODUCING THE SEMICONDUCTOR STRUCTURE

CROSS-REFERENCE TO RELATED APPLICATION

This application is a continuation of copending International Application No. PCT/DE00/00298, filed Feb. 1, 2000, which designated the United States.

BACKGROUND OF THE INVENTION

FIELD OF THE INVENTION

The invention lies in the field of semiconductor manufacture and pertains, more specifically, to a semiconductor structure in an integrated circuit having an insulating layer on a support and having an interconnect arranged above the insulating layer. The invention also pertains to a method for fabricating the structure.

In integrated circuits, for the purpose of driving the individual components, interconnects are required as wiring. In many cases, these interconnects also lead over an active region or other conductive structures, giving rise to parasitic capacitances which impair the speed of the circuit.

It is a fundamental goal in integrated circuits to reduce these parasitic capacitances. This is especially true as the integration level increases, since the interconnects increasingly have to be routed over active regions and the use of thicker insulation layers below the interconnects has led to an increase in the aspect ratios and topology steps that occur, which in turn leads to difficulties in terms of process engineering.

Furthermore, interconnects in integrated circuits are used as word lines of transistors. Over an active region in the semiconductor substrate which has two spaced-apart regions, doped oppositely to the conductivity type of the substrate, an interconnect forms the gate of a MOS transistor. The transistor can be switched by means of the gate potential. In many cases it is desirable for a transistor in a circuit to be always open (or always closed) independently of the gate potential. A predetermined integrated circuit can be programmed in this way.

SUMMARY OF THE INVENTION

It is accordingly an object of the invention to provide a semiconductor structure having an interconnect, which overcomes the above-mentioned disadvantages of the heretofore-known devices and methods of this general type and which, on the one hand, has a low parasitic capacitance, and also a method for fabricating such a semiconductor structure. It is a further object to specify a semiconductor structure having an interconnect which allows simple programming of transistors, and also a corresponding programming method.

With the foregoing and other objects in view there is provided, in accordance with the invention, a semiconductor structure in an integrated circuit, comprising:

an insulating layer on a support;

an interconnect above the insulating layer and separated by a cavity from the insulating layer;

an insulating covering laterally adjoining, in the form of a spacer, the interconnect, the cavity and an upper surface of the interconnect;

the covering having an opening formed therein, extending beyond the interconnect on one side of the interconnect; and a further insulation layer covering the covering and the opening.

The invention is based on the idea of arranging the interconnect (i.e., the conductor track) on a cavity. The lower surface of the cavity adjoins an insulating layer on a support, the upper surface of the cavity adjoins the interconnect and, on two opposite sides, said cavity adjoins an insulating covering. The insulating covering also covers the side walls of the interconnect. In other words, below a section of the electrically conductive interconnect there extends a cavity having essentially the same lateral dimensions as the interconnect. The cavity is preferably filled with air or an essentially inert gas; in particular, it is partially evacuated.

Transversely with respect to the interconnect direction, the cavity essentially has the same width as the interconnect width. In the direction of the interconnect, the cavity can extend below the entire interconnect. However, the interconnect can also have a section in which it is arranged on a lower conductive layer; in other words, the cavity is virtually filled here with the lower conductive layer, in particular with n-doped or p$^-$ doped polysilicon. In such a section, the interconnect can be used as the gate of a transistor. The interconnect is preferably composed of a metal silicide.

The support over which the interconnect with underlying cavity is arranged may contain an active region in the form of two spaced-apart doped SID regions of a MOS transistor. In this case, then, the semiconductor structure constitutes a MOS transistor in which the interconnect forms the gate and is isolated from the gate oxide by a cavity. Such a transistor is always in the open state or in the closed state (normally on or normally off depending on the threshold voltage chosen) independently of the gate potential.

With the above and other objects in view there is also provided, in accordance with the invention, a method of fabricating a semiconductor structure, which comprises:

forming an insulating layer on a support;

applying a lower conductive layer and an upper conductive layer on the insulating layer and patterning the conductive layers in track form;

forming an insulating covering in the form of a spacer on side walls of the lower and upper conductive layers;

producing an opening in the insulating covering, the opening extending beyond the upper conductive layer only on one side of the upper conductive layer and uncovering a surface of the lower conductive layer;

selectively removing the lower conductive layer; and closing the opening with a further insulating material.

In accordance with a preferred embodiment, the lower conductive layer is fabricated from doped polysilicon and the upper conductive layer is fabricated from a silicide.

In other words, the method for fabricating the semiconductor structure provides for an insulating layer to be applied on a support and then for a lower conductive layer and an upper conductive layer to be applied. The upper conductive layer may also be a multiple layer. The two conductive layers are patterned, preferably simultaneously, in track form in accordance with the interconnect to be fabricated. An insulating covering is formed on the uncovered surfaces of the lower and upper conductive layers. An opening is then produced in the insulating covering, which at least partly uncovers a surface of the lower conductive layer. Through this opening, the lower conductive layer is selectively removed with the aid of an essentially isotropic etching method. The opening is closed with a further insulating material. Preferably, the lower conductive layer is composed of n-doped or p-type polysilicon, and the upper conductive layer is composed of a silicide. KOH, in particular, can be used for etching the lower conductive layer, i.e. for producing the cavity.

If the cavity is intended to be produced over a relatively long section of the interconnect, it is advantageous to arrange a plurality of openings in the covering at a predetermined distance from one another along the interconnect.

With the aid of the method, a transistor formed in the semiconductor substrate can be programmed in a simple manner: depending on the arrangement of an opening in the insulating covering and on the etching time, either a cavity is formed above the channel region of the transistor, or the lower conductive layer remains and forms part of the gate. Only in the latter case is the transistor controlled by way of the potential of the gate. The invention thus enables a mask-programmable circuit.

It is a significant advantage that it is possible to use customary method steps for fabricating an interconnect, in particular a word line in a memory circuit, and it is necessary merely to carry out an etching process (using phototechnology) for opening the insulating covering and the subsequent cavity etching process. In some DRAM concepts, it is even the case that these etching processes are already implemented for forming other structures—for example a conductive strap which connects the selection transistor to a storage capacitor—, and so all that is required is design optimization for the opening of the insulating covering. An example of such a fabrication method is disclosed in U.S. Pat. No. 5,185,294 (European EP 543 158 A2) and U.S. Pat. No. 5,731,218 (European EP 651 433 A1—in particular columns 5 and 6).

Other features which are considered as characteristic for the invention are set forth in the appended claims.

Although the invention is illustrated and described herein as embodied in a semiconductor structure having an interconnect, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
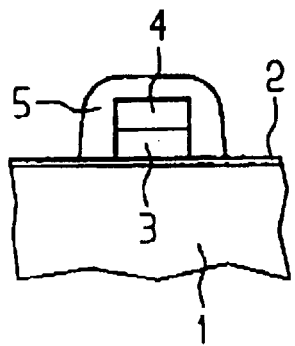
FIG. 1 is a partial sectional view taken through a semiconductor substrate for illustrating the novel semiconductor substrate and a first method step in the production of the structure.

Referring now to the figures of the drawing in detail and first, particularly, to FIG. 1 thereof, a silicon oxide layer is applied as insulating layer 2 on a support 1, for example a silicon semiconductor substrate. The silicon oxide layer can be used as gate oxide in specific sections of the circuit. On it, n-doped polysilicon is applied as a lower conductive layer 3 and a metal silicide, in particular $Wsi_x$, is applied as an upper conductive layer 4. These layers are deposited with conventional process steps. The double layer 3, 4 is patterned in track form (cf. FIG. 2), and provided with an insulating covering 5 on the free surfaces. The insulating covering may comprise a part bearing on the upper conductive layer 4, and lateral spacers, the bearing part being patterned in track form together with the conductive layers 3, 4 and the spacers subsequently being produced on the side walls. This procedure is known for the all-around encapsulation of interconnects, for example word lines. The insulating cover may be composed, in particular, of silicon oxide and/or silicon nitride.

Figure 2:
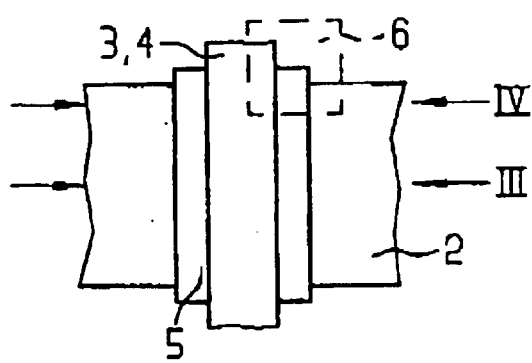
FIG. 2 is a plan view onto the structure.

With reference to FIG. 2, there is illustrated, in a diagrammatic plan view, the position of the lower and upper conductive layers 3, 4 and of the insulating covering 5. The region illustrated by broken lines indicates the position of an opening 6 in the photomask to be applied. Outside the opening, the configuration is covered with photoresist. The opening must overlap the insulating covering, to be precise to an extent such that an etching process uncovers a side wall of the lower interconnect 3. If a strictly anisotropic etching process is used, the opening 6 must extend as far as the side wall. The interconnect is overlapped. The opening 6 extends beyond the upper interconnect 4 only on one side of the upper interconnect 4. The upper interconnect 4 is not attached during the fabrication of the opening.

Figure 3:
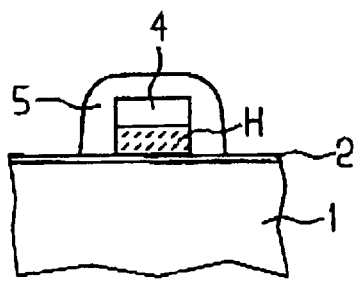
FIG. 3 is a section taken through the structure along a line defined by the arrows III—III in FIG. 2.
Figure 4:
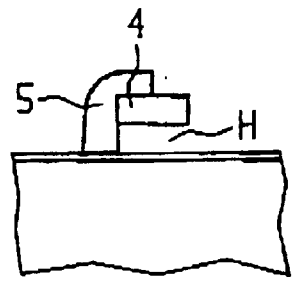
FIG. 4 is a section taken through the structure along a line defined by the arrows IV—IV in FIG. 2.

With reference to FIGS. 3 and 4, the insulating covering is etched with the aid of the photomask with the opening 6. Afterward, if appropriate once the photomask has been removed, the n-doped polysilicon 3 is removed using an isotropic etching process. An etching process using a KOH solution is suitable for this purpose. The upper conductive layer 4 composed of silicide and the insulating covering 5 are not attacked. FIG. 3 shows the resulting configuration in cross section at a point removed from the opening 6 (cf. FIG. 2); FIG. 4 shows a cross section in the region of the opening. A cavity H is formed below the upper conductive layer 4. In order to ensure the removal of the n-type polysilicon 3, the openings 6 are provided at a plurality of points at a predetermined distance along the track. The upper interconnect 4 is not attacked during the fabrication of the opening.

Figure 5:
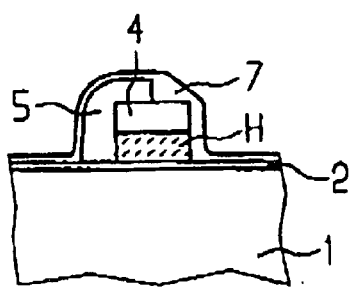
FIGS. 5 and 6 are further partial sectional views similar to FIG. 1 and illustrating further steps and an alternative embodiment in the production of the semiconductor structure.

With reference to FIG. 5, the hole formed in the insulating covering is closed again in the region of the opening 6. For this purpose, a layer 7 made of the material of the insulating covering is preferably deposited over the whole area. A boron- or phosphorous-doped glass, as is usually used as so-called "sub-layer dielectric", is preferably used as the layer 7. In other words, a separate process step is not necessary for closing the opening, if the method is integrated into a customary process. In the completed semiconductor structure, the parasitic capacitances are greatly reduced without appreciable disadvantages with regard to the conductivity of the interconnect. The dielectric between the interconnect and underlying structures in the support is composed of the insulating layer 2 (preferably a gate oxide) having a thickness of a few nm and of the cavity, which is preferably filled with air and whose vertical extent preferably lies in the range of 200 to 800 nm.

Figure 6:
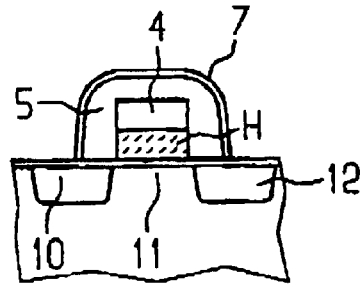

FIG. 6 illustrates the application of the invention to a support with a MOS transistor. The support contains doped regions 10, 12 having the opposite conductivity type to that of the semiconductor substrate 1. A channel region 11 is situated between the doped regions 10, 12, which constitute source and drain. The interconnect 4 is routed as gate over the channel region and insulated from the substrate by the insulating layer 2. The cavity (H), which has been fabricated according to the invention, is situated between the interconnect 4 and the insulating layer 2. The transistor illustrated is not switched by a potential present on the interconnect 4.

I claim:

1. A semiconductor structure in an integrated circuit, comprising:

an insulating layer on a support;

an interconnect above said insulating layer and separated by a cavity from said insulating layer;

an insulating covering laterally adjoining, in the form of a spacer, said interconnect, said cavity and an upper surface of said interconnect;

said covering having an opening formed therein, extending beyond said interconnect on one side of said interconnect; and a further insulation layer covering said covering and said opening.

2. The semiconductor structure according to claim 1, wherein said cavity and said interconnect have a substantially equal width.

3. The semiconductor structure according to claim 1, wherein said support has an active region beneath said cavity.

4. The semiconductor structure according to claim 3, wherein said active region is a channel region of a MOS transistor.

5. The semiconductor structure according to claim 1, which comprises a lower conductive layer arranged below a section of said interconnect instead of said cavity.

6. The semiconductor structure according to claim 5, wherein said lower conductive layer is made of doped polysilicon.

7. The semiconductor structure according to claim 1, wherein said cavity is filled with air.

8. The semiconductor structure according to claim 1, wherein said interconnect is composed of a silicide.

9. The semiconductor structure according to claim 1, wherein said insulating layer is composed of silicon oxide.

* * * * *

UNITED STATES PATENT AND TRADEMARK OFFICE
CERTIFICATE OF CORRECTION

PATENT NO. : 6,724,055 B2
DATED : April 20, 2004
INVENTOR(S) : Gerd Lichter

It is certified that error appears in the above-identified patent and that said Letters Patent is hereby corrected as shown below:

Title page,
Item [63], Related U.S. Application Data, should read as follows:
-- Continuation of application No. PCT/DE00/00298, filed on Feb. 1, 2000. --

Signed and Sealed this

First Day of March, 2005

JON W. DUDAS
*Director of the United States Patent and Trademark Office*